(12) United States Patent
Zenou et al.

(10) Patent No.: US 10,015,887 B2
(45) Date of Patent: Jul. 3, 2018

(54) TWO-STEP, DIRECT-WRITE LASER METALLIZATION

(71) Applicant: ORBOTECH LTD., Yavne (IL)

(72) Inventors: Michael Zenou, Hashmonaim (IL); Marc Altman, Rehovot (IL); Claudio Rottman, Modiin (IL); Zvi Kotler, Tel Aviv (IL)

(73) Assignee: ORBOTECH LTD., Yavne (IL)

( * ) Notice: Subject to any disclaimer, the term of this patent is extended or adjusted under 35 U.S.C. 154(b) by 125 days.

(21) Appl. No.: 14/766,749

(22) PCT Filed: Feb. 18, 2014

(86) PCT No.: PCT/IL2014/000014
§ 371 (c)(1),
(2) Date: Aug. 9, 2015

(87) PCT Pub. No.: WO2014/125470
PCT Pub. Date: Aug. 21, 2014

(65) Prior Publication Data
US 2015/0382476 A1    Dec. 31, 2015

Related U.S. Application Data

(60) Provisional application No. 61/765,808, filed on Feb. 18, 2013.

(51) Int. Cl.
*H05K 3/12* (2006.01)
*G03F 7/40* (2006.01)
(Continued)

(52) U.S. Cl.
CPC ............... *H05K 3/12* (2013.01); *G03F 7/40* (2013.01); *H05K 3/02* (2013.01); *H05K 3/027* (2013.01);
(Continued)

(58) Field of Classification Search
None
See application file for complete search history.

(56) References Cited

U.S. PATENT DOCUMENTS 3,917,794 A    11/1975    Akagi et al.
4,299,910 A    11/1981    Hung et al.
(Continued)

FOREIGN PATENT DOCUMENTS

JP    2002075999 A    3/2002
JP    2002220551 A    8/2002
(Continued)

OTHER PUBLICATIONS

International Application No. PCT/IB2015/052476 Search Report dated Aug. 31, 2015.
(Continued)

*Primary Examiner* — Shamim Ahmed
*Assistant Examiner* — Bradford M Gates
(74) *Attorney, Agent, or Firm* — D. Kligler IP Services Ltd.

(57) ABSTRACT

A method for manufacturing includes coating a substrate (22) with a matrix (28) containing a material to be patterned on the substrate. A pattern (42) is fixed in the matrix by directing an energy beam to impinge on the coated substrate so as to fix the pattern in the matrix without fully sintering the pattern. The matrix remaining on the substrate outside the fixed pattern is removed, and after removing the matrix, the material in the pattern is sintered.

25 Claims, 2 Drawing Sheets

(51) Int. Cl.
  *H05K 3/02* (2006.01)
  *G03F 7/039* (2006.01)
  *H05K 3/22* (2006.01)
  *H05K 1/09* (2006.01)

(52) U.S. Cl.
  CPC ........... *H05K 3/1291* (2013.01); *G03F 7/039* (2013.01); *H05K 1/097* (2013.01); *H05K 3/1283* (2013.01); *H05K 3/227* (2013.01); *H05K 2201/0257* (2013.01); *H05K 2201/2054* (2013.01); *H05K 2203/0514* (2013.01); *H05K 2203/107* (2013.01); *H05K 2203/108* (2013.01); *H05K 2203/111* (2013.01); *H05K 2203/1131* (2013.01); *H05K 2203/1194* (2013.01); *H05K 2203/1476* (2013.01); *H05K 2203/1484* (2013.01)

(56) References Cited

U.S. PATENT DOCUMENTS

| | | |
|---|---|---|
| 4,496,607 A | 1/1985 | Mathias |
| 4,508,753 A | 4/1985 | Stepan |
| 4,931,323 A | 6/1990 | Manitt et al. |
| 5,541,145 A | 7/1996 | Harris et al. |
| 5,745,834 A | 4/1998 | Bampton et al. |
| 5,932,055 A | 8/1999 | Newell et al. |
| 6,159,832 A | 12/2000 | Mayer |
| 6,315,927 B1 | 11/2001 | Kuboto et al. |
| 6,348,295 B1 | 2/2002 | Griffith et al. |
| 6,348,737 B1 | 2/2002 | Advocate, Jr. et al. |
| 6,660,457 B1 | 12/2003 | Imai et al. |
| 6,676,892 B2 | 1/2004 | Das et al. |
| 6,723,278 B1 | 4/2004 | Lu et al. |
| 6,921,626 B2 | 7/2005 | Ray et al. |
| 7,294,449 B1 | 11/2007 | Gudeman et al. |
| 7,615,581 B2 | 11/2009 | Choi et al. |
| 7,750,076 B2 | 7/2010 | Laude |
| 7,928,322 B2 | 4/2011 | Oki et al. |
| 8,021,821 B2 | 9/2011 | Nagai et al. |
| 8,101,337 B2 | 1/2012 | Kim et al. |
| 2002/0039628 A1* | 4/2002 | Ogawa .............. G02F 1/133719 428/1.2 |
| 2002/0094382 A1 | 7/2002 | Imai et al. |
| 2003/0075532 A1 | 4/2003 | Salmon et al. |
| 2004/0241585 A1 | 12/2004 | Kato et al. |
| 2005/0208203 A1 | 9/2005 | Church et al. |
| 2005/0230242 A1 | 10/2005 | Leonhardt et al. |
| 2008/0250972 A1 | 10/2008 | Oldenzijl |
| 2008/0286488 A1 | 11/2008 | Li et al. |
| 2009/0011143 A1 | 1/2009 | Yatsunami et al. |
| 2009/0242854 A1 | 10/2009 | Li et al. |
| 2009/0274833 A1 | 11/2009 | Li et al. |
| 2009/0298299 A1 | 12/2009 | Cain et al. |
| 2010/0035375 A1 | 2/2010 | Grigoropoulos et al. |
| 2010/0129566 A1 | 5/2010 | Lee et al. |
| 2010/0276405 A1 | 11/2010 | Cho et al. |
| 2011/0003246 A1 | 1/2011 | Kuroki |
| 2011/0043965 A1 | 2/2011 | Yaniv et al. |
| 2012/0015112 A1 | 1/2012 | Yang et al. |

FOREIGN PATENT DOCUMENTS

| | | |
|---|---|---|
| JP | 2003131365 A | 5/2003 |
| WO | 0307049 A1 | 5/2003 |
| WO | 2012008204 A1 | 1/2012 |
| WO | 2012124438 A1 | 9/2012 |

OTHER PUBLICATIONS

Theodorakos et al., "Selective Laser Sintering of Ag Nanoparticles Ink for Applications in Flexible Electronics", Applied Surface Science, vol. 336, pp. 157-162, May 1, 2015.
Kumpulainen et al., "Low Temperature Nanoparticle Sintering with Continuous Wave and Pulse Lasers", Journal Optics and Laser Technology, vol. 43, Issue 3, pp. 570-576, Apr. 2011.
International Application # PCT/IL2014/000014 Search Report dated May 29, 2014.
Marcus et al., "Solid Freeform Fabrication Proceedings", 397 pages, Sep. 1993.
Simchi, A., "Direct laser sintering of metal powders: Mechanism, kinetics and microstructural features", Materials Science and Engineering A, vol. 428, Issue 1-2, pp. 148-158, Apr. 2006.
Tien et al., "Precision laser metallization", Microelectronic Engineering, vol. 56, pp. 273-279, Oct. 24, 2000.
Regenfuss et al., "Principles of Laser Micro Sintering", pp. 740-753, Sep. 14, 2006.
Toray Industries, Inc., "The functioned photodefinable hybrid materials—RAYBRID", 36 pages, Jun. 2009.
Intrinsiq Materials Inc., "Copper Inkjet Ink—CI-002", data sheet, 3 pages, year 2013.
European Application # 14751180 Search Report dated Apr. 18, 2017.
JP Application # 2015-557563 office action dated Nov. 14, 2017.
TW Application # 103105324 Office Action dated Dec. 19, 2017.

\* cited by examiner

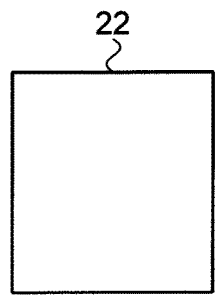 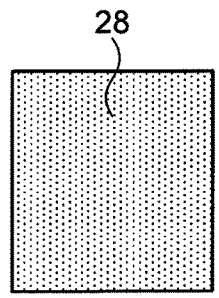 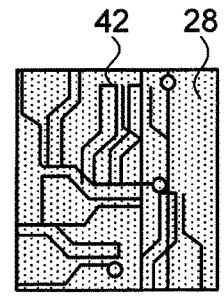
FIG. 2A  FIG. 2B  FIG. 2C
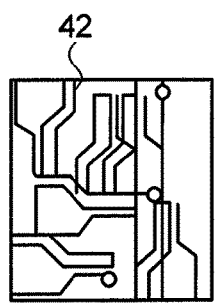 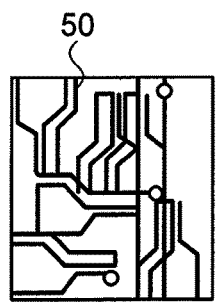
FIG. 2D  FIG. 2E
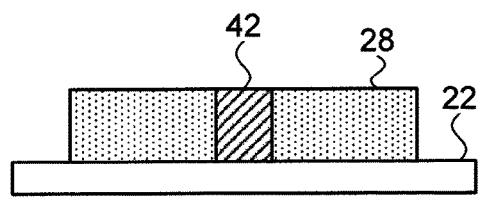 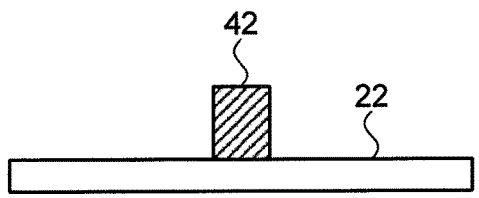
FIG. 3A  FIG. 3B

TWO-STEP, DIRECT-WRITE LASER METALLIZATION

CROSS-REFERENCE TO RELATED APPLICATIONS

This application claims the benefit of U.S. Provisional Patent Application 61/765,808, filed Feb. 18, 2013, which is incorporated herein by reference.

FIELD OF THE INVENTION

The present invention relates generally to production of printed wiring on circuit substrates, and particularly to methods and systems for direct writing of metal features.

BACKGROUND

Direct laser sintering of metal inks is a known technique for metallization of printed wiring. For example, U.S. Patent Application Publication 2008/0286488 describes a method of forming a conductive film based on depositing a non-conductive film on a surface of a substrate. The film contains a plurality of copper nanoparticles, and exposing at least a portion of the film to light makes the exposed portion conductive by photosintering or fusing the copper nanoparticles.

SUMMARY

Embodiments of the present invention provide enhanced methods and systems for laser-based direct writing of traces onto a substrate.

There is therefore provided, in accordance with an embodiment of the present invention, a method for manufacturing, which includes coating a substrate with a matrix containing a material to be patterned on the substrate. A pattern is fixed in the matrix by directing an energy beam to impinge on a locus of the pattern so as to heat the matrix sufficiently to cause adhesion of the material to the substrate along a trace of the pattern without fully sintering the material in the trace. The matrix remaining on the substrate outside the fixed pattern is removed, and after removing the matrix, the material in the pattern is sintered.

In some embodiments, the material to be patterned includes nanoparticles.

Typically, sintering the material includes applying a bulk sintering process to the pattern fixed on the substrate.

Coating the substrate may include drying the matrix on the substrate before irradiating the coated substrate. Additionally or alternatively, removing the matrix may include applying a solvent to remove the matrix remaining on the substrate outside the fixed pattern.

There is also provided, in accordance with an embodiment of the present invention, a method for manufacturing, which includes coating a substrate with a matrix containing a material to be patterned on the substrate. The coated substrate is irradiated with an energy beam so as to fix a pattern in an outer layer of the matrix without fixing a bulk of the matrix or sintering the material that is to be patterned in the matrix. The matrix remaining on the substrate outside the fixed pattern is removed, and after removing the matrix, the material in the pattern is sintered.

In one embodiment, the matrix includes a photosensitive surfactant additive, and irradiating the coated substrate activates the additive so as to cause the additive to form the fixed pattern in the outer layer of the matrix. In another embodiment, coating the substrate includes applying a photosensitive layer over the matrix, and irradiating the coated substrate activates the photosensitive layer.

Typically, irradiating the coated substrate causes polymerization or crosslinking of the outer layer of the matrix. In one embodiment, coating the substrate includes applying a photoinitiator to the matrix, and irradiating the coated substrate causes the photoinitiator to release free radicals in the outer layer, which induce the polymerization or crosslinking. Alternatively or additionally, irradiating the coated substrate causes heating in the outer layer, which thermally induces the polymerization or crosslinking.

In some embodiments, the material to be patterned includes nanoparticles, and sintering the material includes applying a bulk sintering process to the pattern fixed on the substrate. Coating the substrate may include drying the matrix on the substrate before irradiating the coated substrate.

In some embodiments, irradiating the coated substrate includes directing the energy beam to impinge on a locus of the pattern. In other embodiments, irradiating the coated substrate includes directing the energy beam to impinge on an area of the coated substrate area that excludes the locus of the pattern.

Removing the matrix typically includes applying a solvent to remove the matrix remaining on the substrate outside the fixed pattern. Alternatively or additionally removing the matrix may include ablating the matrix remaining on the substrate outside the fixed pattern.

There is additionally provided, in accordance with an embodiment of the present invention, a method for manufacturing, which includes coating a substrate with a matrix containing nanoparticles to be patterned on the substrate. The coated substrate is irradiated with an energy beam so as to fix a pattern in the matrix without fully sintering the nanoparticles. The matrix remaining on the substrate outside the fixed pattern is removed, and after removing the matrix, the nanoparticles in the pattern are sintered.

In some embodiments, the matrix includes a photosensitive additive, and irradiating the coated substrate includes activating the additive within the pattern. In a disclosed embodiment, both an outer surface and a bulk of the matrix are activated by irradiation of the coated substrate. Typically, activation of the additive causes at least one of dimerization, polymerization, and crosslinking of a molecular component within the pattern.

Additionally or alternatively, irradiating the coated substrate releases thermal energy in the matrix, which causes at least one of polymerization and crosslinking of a molecular component within the pattern.

In one embodiment, the matrix includes an anhydride component and a solvent, and irradiating the coated substrate cures the anhydride component by selectively removing the solvent within the pattern.

In another embodiment, the matrix includes an alkyd, and wherein irradiating the coated substrate causes air-dry induced polymerization of the alkyd.

In still another embodiment, in which the nanoparticles include a metal, and irradiating the coated substrate causes formation of a coordination polymer linking the metal to a ligand.

In yet another embodiment, the matrix includes a sacrificial resin, and irradiating the coated substrate modifies a state of the resin so as to cause cohesion between the nanoparticles.

There is further provided, in accordance with an embodiment of the present invention, a method for manufacturing, which includes coating a substrate with a matrix containing a material to be patterned on the substrate. An energy beam is directed to impinge on an area of the coated substrate that excludes a locus of a pattern of the material that is to be formed on the substrate, wherein irradiation by the energy beam increases a solubility of the matrix in the area. A solvent is applied to remove the matrix in the area of the substrate outside the locus of the pattern. After removing the matrix, the material in the pattern is sintered.

In one embodiment, the matrix includes a supramolecular polymer, and the irradiation by the energy beam causes a decomposition of the supramolecular polymer.

In another embodiment, the matrix includes a latent acid, which is activated by the irradiation by the energy beam.

In yet another embodiment, the matrix includes a polymer, and the irradiation by the energy beam causes a hydrolysis of the polymer.

There is moreover provided, in accordance with an embodiment of the present invention, a method for manufacturing, which includes coating a substrate with a matrix containing a material to be patterned on the substrate. The coated substrate is irradiated with a first energy beam so as to fix a pattern in the matrix while increasing a reflectivity of the matrix within a locus of the pattern by directing the energy beam to impinge on the locus of the pattern without fully sintering the material in the matrix. The matrix remaining on the substrate outside the fixed pattern is ablated, without ablating the locus of the pattern, by irradiating the matrix with a second energy beam at a fluence that is less than an ablation threshold of the matrix within the locus of the pattern. After ablating the matrix, the material in the pattern is sintered.

There is furthermore provided, in accordance with an embodiment of the present invention, a method for manufacturing, which includes coating a substrate with a matrix containing a metal complex to be patterned on the substrate. The coated substrate is irradiated with an energy beam so as to fix a pattern in the matrix while causing the metal complex to form metal particles in the matrix without fully sintering the metal particles. The matrix remaining on the substrate outside the fixed pattern is removed, and after removing the matrix, the metal particles in the pattern are sintered.

There is also provided, in accordance with an embodiment of the present invention, a system for manufacturing, including a coating machine, which is configured to coat a substrate with a matrix containing a material to be patterned on the substrate. A writing machine is configured to fix, a pattern in the matrix by directing an energy beam to impinge on a locus of the pattern so as to heat the matrix sufficiently to cause adhesion of the material to the substrate along a trace of the pattern without fully sintering the material in the trace. A matrix removal machine is configured to remove the matrix remaining on the substrate outside the fixed pattern. A sintering machine is configured to sinter the material in the pattern after removal of the matrix.

In some embodiments, the system includes a drying machine, which is configured to dry the matrix on the substrate before the coated substrate is irradiated.

There is additionally provided, in accordance with an embodiment of the present invention, a system for manufacturing, including a coating machine, which is configured to coat a substrate with a matrix containing a material to be patterned on the substrate. A writing machine is configured to irradiate the coated substrate with an energy beam so as to fix a pattern in an outer layer of the matrix without fixing a bulk of the matrix or sintering the material that is to be patterned in the matrix. A matrix removal machine is configured to remove the matrix remaining on the substrate outside the fixed pattern. A sintering machine is configured to sinter the material in the pattern after removal of the matrix.

There is further provided, in accordance with an embodiment of the present invention, a system for manufacturing, including a coating machine, which is configured to coat a substrate with a matrix containing nanoparticles to be patterned on the substrate. A writing machine is configured to irradiate the coated substrate with an energy beam so as to fix a pattern in the matrix without fully sintering the nanoparticles. A matrix removal machine is configured to remove the matrix remaining on the substrate outside the fixed pattern. A sintering machine is configured to sinter the material in the pattern after removal of the matrix.

There is moreover provided, in accordance with an embodiment of the present invention, a system for manufacturing, including a coating machine, which is configured to coat a substrate with a matrix containing a material to be patterned on the substrate. A writing machine is configured to direct an energy beam to impinge on an area of the coated substrate that excludes a locus of a pattern of the material that is to be formed on the substrate, wherein irradiation by the energy beam increases a solubility of the matrix in the area. A matrix removal machine is configured to apply a solvent to remove the matrix in the area of the substrate outside the locus of the pattern. A sintering machine is configured to sinter the material in the pattern after removal of the matrix.

There is furthermore provided, in accordance with an embodiment of the present invention, a system for manufacturing, including a coating machine, which is configured to coat a substrate with a matrix containing a material to be patterned on the substrate. A writing machine is configured to irradiate the coated substrate with a first energy beam so as to fix a pattern in the matrix while increasing a reflectivity of the matrix within a locus of the pattern by directing the energy beam to impinge on the locus of the pattern without fully sintering the material in the matrix. A matrix removal machine is configured to ablate the matrix remaining on the substrate outside the fixed pattern without ablating the locus of the pattern by irradiating the matrix with a second energy beam at a fluence that is less than an ablation threshold of the matrix within the locus of the pattern, wherein the material in the pattern is sintered when the matrix has been ablated.

There is also provided, in accordance with an embodiment of the present invention, a system for manufacturing, including a coating machine, which is configured to coat a substrate with a matrix containing a metal complex to be patterned on the substrate. A writing machine is configured to irradiate the coated substrate with an energy beam so as to fix a pattern in the matrix while causing the metal complex to form metal particles in the matrix without fully sintering the metal particles. A matrix removal machine is configured to remove the matrix remaining on the substrate outside the fixed pattern. A sintering machine is configured to sinter the material in the pattern after removal of the matrix.

The present invention will be more fully understood from the following detailed description of the embodiments thereof, taken together with the drawings in which:

BRIEF DESCRIPTION OF THE DRAWINGS

FIGS. 2A-2E are schematic top views of a substrate on which a pattern of traces is written, illustrated in successive stages of a process of forming the pattern, in accordance with an embodiment of the present invention; and FIGS. 3A and 3B are schematic sectional views of a substrate on which a trace is written, illustrated in successive stages of a process of forming the trace, in accordance with an embodiment of the present invention.

DETAILED DESCRIPTION OF EMBODIMENTS

Overview

Figure 1:
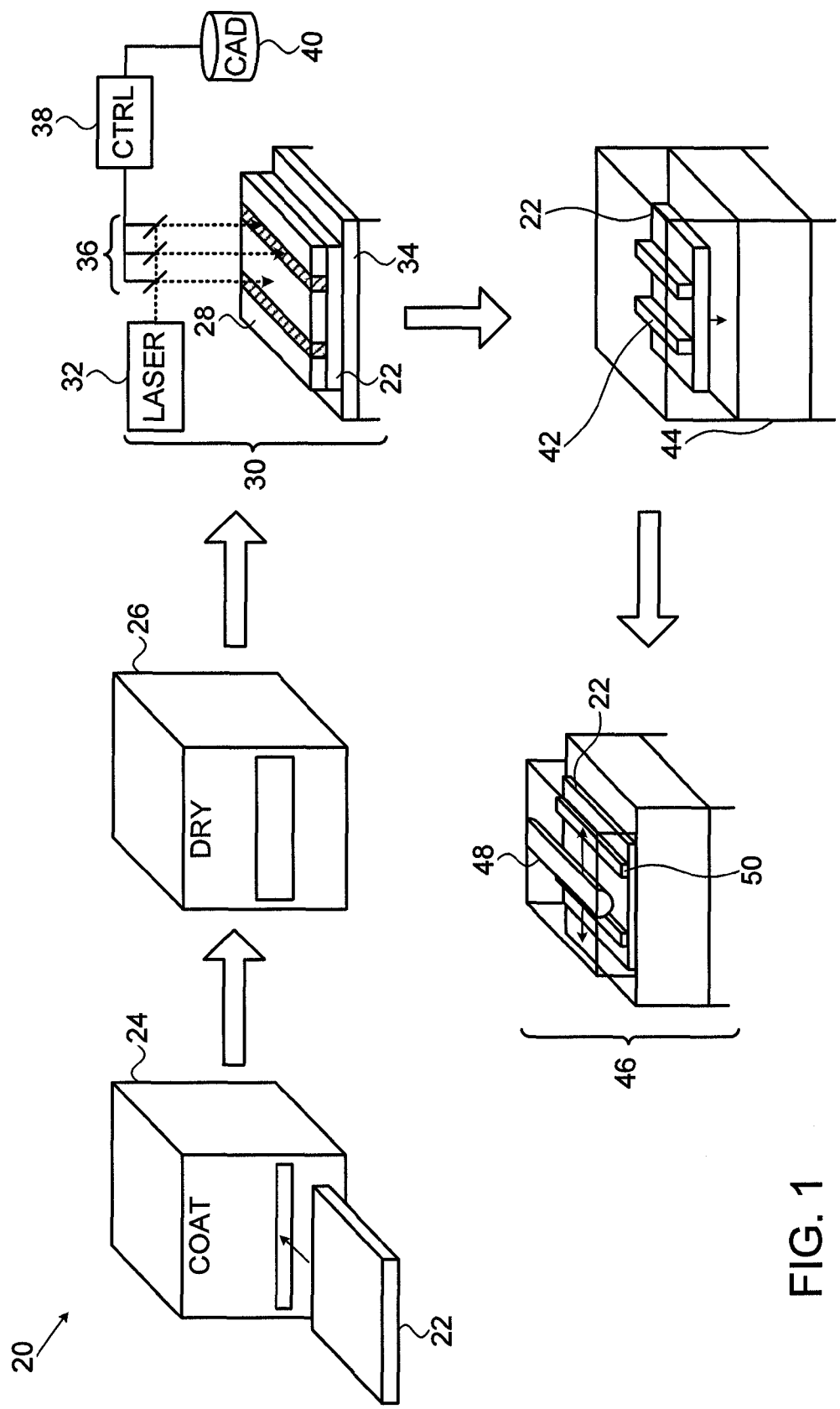
FIG. 1 is schematic, pictorial illustration showing a system for laser-based direct writing and stages in the operation of the system, in accordance with an embodiment of the present invention.

One-step, direct laser sintering of metal inks and other nanoparticle sinterable inks often does not give sufficiently uniform results. (The term "nanoparticle" is used in the present description and in the claims to mean a microscopic particle having at least one dimension less than 100 nm.) This problem stems, at least in part, from heat conduction that occurs during the local sintering process. Non-uniform heat diffusion under these conditions leads to thermal variations, which in turn cause inconsistent sintering. This effect is most pronounced when dealing with high-resolution patterning of small metallic features, on the order of a few microns. At the same time, direct sintering of metal inks requires high laser fluence, on the order of tens to hundreds of $J/cm^2$, which makes the process slow and inefficient when dealing with large-area patterns.

Embodiments of the present invention that are described herein address this problem by separating the steps of writing and sintering. A substrate is coated with a suitable matrix, and may be dried after coating to remove excess solvent. (Such matrices typically comprise an ink, paste or suspension containing metal nanoparticles, and are referred to herein generically, for the sake of convenience, simply as "NP inks.") An energy beam source, such as a laser, then scans over the substrate to write the desired pattern without fully sintering the nanoparticles. The term "without fully sintering," as used in the present description and in the claims, means that the nanoparticles in the bulk of the matrix remain substantially separate from one another, such that the resistivity of the traces at this stage is still at least ten times greater than the final resistivity that is to be achieved after full sintering.

This stage of the process, in which the energy beam writes the pattern, is referred to herein as "fixing" the pattern in the matrix. In some embodiments, the beam scans over the traces of the pattern to be written on the substrate with fluence sufficient to stabilize the matrix against subsequent removal, relative to the non-irradiated matrix, but substantially below the threshold for sintering. In other embodiments, using different sorts of matrix materials, the beam scans over the areas outside the desired pattern of traces so as to destabilize the matrix in these areas relative to the non-irradiated traces. Different types of nanoparticle matrices and concomitant fixation techniques are described hereinbelow.

After the pattern has been fixed in this fashion, the matrix is removed from all non-fixed areas, so that only the stabilized pattern remains. Such removal may be accomplished, for example, by application of chemical solvents or by radiative ablation. Typically, the substrate is then heated uniformly in a bulk sintering process in order to sinter the nanoparticles in the remaining pattern. This approach achieves uniform metallization, in contrast to the inhomogeneity that is commonly encountered when direct laser sintering is used.

The disclosed embodiments thus provide a simple, fast metallization process, with fewer steps than conventional methods. The first step of the process involves only relatively low laser power. Subsequently, the actual metallization step—the bulk sintering process—which requires a high fluence, can be carried out using a high-power source with large area coverage, such as a thermal source or light strip illumination by a high-power flash lamp or a high-power laser or laser array. Because these embodiments avoid the high local temperatures that are associated with one-step direct laser sintering, they are appropriate for use in patterning of delicate, flexible substrates, such as plastics and foils.

The use of a laser for direct writing in embodiments of the present invention achieves high resolution, with the possibility of adaptive registration (as in digital imaging techniques). The metal lines that are created by the disclosed techniques can reach widths as small as a few microns. The resolution is limited only by the laser spot size, which can general be focused to the range of 1-2 µm, or even less. The resolution and the quality of line definition can be improved by tuning the parameters of the laser during the scan. Arbitrary patterns can be drawn in this manner, possibly working directly from computer-aided design and manufacturing (CAD/CAM) data.

On the other hand, some embodiments of the present invention are capable of creating thicker metal lines than can generally be achieved by direct laser sintering, because the laser writing step can be accomplished without a drastic temperature increase or change in thermal conductivity throughout the trace that is to be fixed. Once the traces have been defined in this manner, full sintering is carried out over a large area, and the results are thus insensitive to variations in local thermal diffusion.

In some embodiments, the entire metallization cycle can be carried out without contacting the substrate. This feature is beneficial particularly for applications such as production of photovoltaic cells and plastic electronics foils.

Other potential applications of the techniques described herein include, for example, display back-end metallization for liquid crystal and organic light-emitting diode (OLED) displays, touch screen metallization, shunting lines for OLED lighting devices, and printed electronic circuits and devices on plastic foils. The techniques described herein may similarly be applied, mutatis mutandis, in writing patterns with a variety of materials on dielectric, ceramic, semiconductor, polymeric, paper and metal substrates.

Although the embodiments disclosed herein refer specifically, for the sake of simplicity, to formation of a single metallization layer, in alternative embodiments multiple layers of this sort may be formed by appropriate repetition of the present techniques, with the same or different inks used in each layer.

System Description

Reference is now made to FIGS. 1 and 2A-2E, which schematically illustrate a system 20 and process of laser-based direct writing, in accordance with an embodiment of the present invention. FIG. 1 is a pictorial illustration showing component apparatus and stages in a process carried out by system 20. FIGS. 2A-2E are schematic top views of a substrate 22 on which a pattern of traces is written in system 20, illustrated in successive stages of the process. As noted earlier, substrate 22 may comprise, for example, glass or other dielectric, ceramic, semiconductor, plastic foil or other polymeric material, paper or metal.

Initially, a coating machine 24 coats substrate 22 (FIG. 2A) with a uniformly-thick layer of a matrix 28 (FIG. 2B), such as metal nanoparticle (NP) ink, metal NP paste, or metal complex ink or paste. Such an ink or paste may contain, for example, silver, copper, nickel, palladium, and/ or gold nanoparticles, as well as alloys of such metals, or possibly non-metallic nanoparticles, such as silicon or nanoceramic particles. The layer thickness of matrix 28 can vary, depending on the final outcome required, from about 0.2 µm to more than 10 µm. Coating machine 24 may apply any suitable area coating technique that is known in the art, such as screen printing, slot-die or bar coating, spray coating, gravure, or spin coating.

Optionally, a drying machine 26 dries the matrix that has been applied to substrate 22. The ink or paste applied by coating machine 24 typically contains a large amount of a solvent, while the metal volumetric content at this stage is no more than about 40%. It may therefore be advantageous— although not mandatory—to dry out the matrix before the laser scanning step in order to enhance the stability of the matrix and reduce loss of laser energy to the solvent. Possible drying methods include low-temperature baking (by convection or by radiation), air flow, vacuum drying, or combinations of these techniques.

A laser writing machine 30 fixes a pattern of traces 42 in matrix 28, as illustrated in FIG. 2C. In a typical implementation, substrate 22 with matrix 28 coated thereon is mounted on a suitable table 34, and a beam scanner 36 scans the beam of a laser 32 (or other suitable energy source) over the substrate. Laser 32 may comprise, for example, a near IR, visible or UV laser, such as a diode-pumped solid-state lasers (DPSS). Lasers of this sort are produced, for example, by Coherent Inc. (Santa Clara, Calif.), including the MATRIX laser operating in the IR with 10 W CW emission, or in the green range at 14 W, or in the UV; or the Verdi laser, operating at 532 nm. Alternatively, laser 32 may comprise a fiber laser produced, for example, by IPG Photonics Corporation (Oxford, Mass.), including the YLR-LP series of IR fiber lasers operating in the range of 1060-1070 nm with power in the range of 10-500 W, single-mode lasers, as well as frequency-doubled green (532 nm) fiber lasers, such the GLR-20 or GLR-50. Further alternatively, laser 32 may comprise a NIR diode laser source, produced, for example by IPG Photonics or by JDS Uniphase Corporation (Milpitas, Calif.) or OCLARO Inc. (San Jose, Calif.), in the range 800 to 1000 nm. As still another alternative, laser 32 may comprise a quasi-CW UV source operating at a repetition rate in the tens of Megahertz, such as the Paladin laser produced by Coherent, with a repetition rate of 80 MHz at 355 nm and an average output power between few watts and several hundred watts.

Laser 32 "writes" the desired pattern in the matrix by exposing the matrix to a well-defined laser power for a certain duration at predetermined positions on the film. The pattern is determined by a controller 38, typically on the basis of suitable CAD/CAM data stored in a memory 40. For high throughput, multiple laser beams (generated by multiple lasers or by splitting a single high-power laser beam into sub-beams, as illustrated in FIG. 1) may be scanned simultaneously over different areas of the substrate, with each beam controlled independently.

FIG. 3A is a schematic sectional view, showing one of traces 42 fixed in matrix 28 by writing machine 30, in accordance with an embodiment of the present invention. Trace 42 typically does not contain a substantial amount of sintered metal at this stage, but is rather in a state of matter that is, due to laser exposure (as the result of a photonic or thermal effect), more adherent to and stable against removal from substrate 22 than the surrounding matrix 28. The laser parameters of writing machine 30, such as laser wavelength, power, spot size and scan speed, are chosen so as to provide the required local change in the matrix properties. The optimal parameters will vary depending on the precise matrix materials and dimensions and the method of writing that is chosen, and will be determined in each case by empirical testing and evaluation. In any case, the power applied at this stage is much less than that required for full sintering of the nanoparticles in the matrix.

After irradiation, a matrix removal machine 44 removes the unfixed matrix 28 from the full area of substrate 22, leaving only traces 42 (FIG. 2D). Machine 44 may comprise a solvent bath, for example, in which the substrate is immersed to wash away the matrix outside the pattern. Alternatively or additionally, machine 44 may apply other sorts of removal techniques, such as chemical or physical ablation of the unfixed matrix.

FIG. 3B is a schematic sectional view of trace 42 remaining on substrate 22 following removal of matrix 28 by machine 44.

Finally, the traces 42 remaining on substrate 22 after matrix removal are sintered in a sintering machine 46, giving sintered traces 50 as shown in FIG. 2E. Sintering machine 46 may comprise a conventional sintering oven, if substrate 22 is suitable for such treatment (as is generally the case with glass substrates, for example). Alternatively, sintering machine 46 may use photonic sintering, which is generally better suited for sensitive substrates, such as plastic foils. Further alternatively, other sintering methods may be appropriate for sensitive substrates, for example plasma sintering or microwave sintering, both of which can sinter a metallic ink pattern without damaging an underlying plastic substrate.

In general, photonic sintering (or microwave or plasma sintering) is preferred over oven sintering when dealing with copper inks in ambient atmosphere, due to the tendency of copper to oxidize easily, as well as with inks containing other metals that are prone to oxidation. Oven sintering of copper inks can be used, as well, in an appropriate atmosphere (i.e., a non-oxidizing atmosphere and/or a reducing atmosphere).

Sintering machine 46 as shown in FIG. 1 uses photonic sintering, with a high-intensity optical source 48 that scans over the surface of substrate 22. Source 48 may comprise, for example, a collection of laser diode bars arranged in a row or in a stack, thus providing the required fluence even over a large area. An average power on the order of several kilowatts is achievable using commercially-available laser diode bars in the near infrared range (roughly 800-1000 nm), such as those produced by Oclaro Inc. (San Jose, Calif.), Coherent Inc. (Santa Clara, Calif.), or Jenoptik (Jena, Germany).

The following sections will describe a variety of different methods that may be applied by writing machine 30 to fix the desired pattern in matrix 28, as well as matrix compositions that are appropriate for use with each of these methods. An ablation-based method for removal of the unfixed matrix based on changes in reflectivity in the writing step will also be described.

Method I—Thermally-Induced Fixation

The present embodiment relies on controlled, local laser heating to eliminate (for example, by combustion, decomposition or evaporation) some of the organic constituents of the dried ink matrix to a sufficient extent to stabilize the irradiated traces. Local laser heating drives out the organic materials of the solvent, as well as other volatile additives and polymers, leaving a denser metal NP state, in which the NPs tend to cohere. This sort of dense, dried-out ink may be stable against solvents in which the ink would otherwise easily dissolve. This method can be applied to commercially-available NP inks without modification or special treatment. A relatively high laser fluence (typically at least 1 $J/cm^2$ and possibly more than 10 $J/cm^2$) may be needed, however, to eliminate a sufficient portion of the organic constituents.

The thermal process used in the present embodiment typically involves heating each location along each trace by laser to a temperature T for a given time duration t. The inventors have found experimentally that a typical minimal time duration on the order of about 0.01 to 1 ms is required to heat the ink sufficiently to remove just enough of the organic material and achieve stability of certain typical metal inks (such as CI-002 from Intrinsiq Materials Ltd., Farnborough, Hampshire, UK). The laser fluence required for this sort of thermal process is about 1-10 $J/cm^2$.

Performing this sort of thermal process over a large area, given the duration and fluence constraints defined above, can take a long time. To reduce the time required to write a pattern on a large substrate, a high-power laser can be used to generate multiple beams, which perform raster scans over different areas of the substrate in parallel, as illustrated in FIG. 1. Additionally or alternatively, an acousto-optic beam deflector can be controlled to draw pattern features in conjunction with mechanical scanning of the substrate in order to accelerate the rate of writing.

When using copper and other oxygen-sensitive inks, local heating should be performed over the shortest duration possible, desirably less than about 0.1 ms, in order to avoid oxidation in atmospheric conditions, since copper tends to oxidize at an accelerated pace when heated. The limitations on exposure time can be relaxed when working in a non-oxidizing atmosphere, such as under nitrogen or argon.

Method II—Bulk Ink Fixation

This group of embodiments makes use of well-controlled formulations of nanoparticle inks, typically incorporating certain additives, so that a much higher sensitivity to laser fluence is obtained. The formulation is selected so as to facilitate rapid fixation of fine trace structures, with high resolution, as well as allowing sintering at relatively low temperatures, suitable for delicate substrates. The additives involved may comprise, for example, photosensitive molecules and/or thermally-sensitive molecules, which are typically selected to have a temperature of decomposition upon sintering that is low enough to allow working with delicate substrates. The mechanism of fixation may be triggered directly by photon absorption within an additive. Alternatively or additionally, absorption of the laser energy by the nanoparticles themselves may result in the release of thermal energy that triggers the desired process.

By appropriate choice of ink formulation, laser fluence on the order of tens of $mJ/cm^2$, as is used in exposing common photoresist materials, may be sufficient to fix the matrix in the present embodiments, thus allowing faster exposure of large areas. Using Method II (as well as Method III, described below), and assuming, for example, that a laser fluence of 50 $mJ/cm^2$ is needed to fix the pattern in the matrix, a laser with CW output power of 10 W will be able to write a pattern in a raster scan over an area of 1 $m^2$ in about 50 sec.

The ink formulations in Method II are chosen so that laser photo-initiation or thermal activation following photonic absorption causes a chemical reaction to take place, which results in a change in stability of the matrix. The mechanism may be based on polymerization or crosslinking, such as dimerization or crosslinking of a soluble monomer or oligomer to form an insoluble dimer or oligomer. Appropriate choice of additives provides a substantial gain in sensitivity to laser fluence, as large as tenfold or even more, relative to Method I, since the mechanism of Method II involves a form of catalysis. Only a low concentration of additive is generally needed to achieve the desired ink performance. An ultraviolet (UV) laser source may be required to activate the additive, but alternatively, any wavelength that is absorbed in the ink layer and activates the appropriate photochemical or thermal reaction may be used.

A number of different chemical approaches may be used in formulating inks with the desired qualities. For example, the ink may contain molecules that are photonically or thermally activated upon irradiation so as to chemically attack an organic protective coating of the nanoparticles and thereby induce local fixation. Blocked-acid molecules (typically at concentrations between 0.5% W to 3% W) may be used for this purpose. The acid generated by photonic activation attacks vulnerable bonds in the protective coating.

Another approach relies on the photoactivation or thermal activation of organic molecules that serve as NP stabilizers (either in a direct protecting layer of the NPs or as dispersant). Such activation results in crosslinking or polymerization either directly or via a linker molecule. For these purposes, for example, a polyvinylpyrrolidone (PVP) and/or a diazide linker may be used.

Other approaches within the scope of Method II may be based on curing of anhydrides by selectively removing solvent, or air-dry induced polymerization.

Some specific examples of mechanisms by which Method II may be implemented will now be described in detail:

Example II.1: Photonic Curing of the Bulk Film by a Photonic Mechanism with UV or Visible Laser Source In some embodiments of the present invention, organic components such as monomers, oligomers or polymers and a photoinitiator are incorporated in the NP ink so as to cause, upon exposure to the laser beam, volume polymerization and/or crosslinking, which renders the matrix insoluble in a given solvent. As described above, the material in the matrix that is not photonically fixed is then stripped away by the solvent. The remaining organic material, however, may cause problems during the subsequent sintering process. It is therefore desirable that all (or nearly all) of the non-conducting material remaining in the matrix be removed without leaving voids or damaging the underlying substrate.

In one embodiment, laser irradiation causes crosslinking of the polymeric components of the NP metal ink suspension that function as dispersants, stabilizers or otherwise assist in maintaining the desired properties of the suspension. Such components may include, for example (but are not limited to), polyvinyl pyrrolidones, polyvinyl butyrals, polyvinyl acids, or their derivatives. A photonically- or thermally-activated linker molecule, such as a diazide, may be added to assist in the crosslinking process. This approach reduces the need to add organic materials that would have to be eliminated in order to achieve sintering of the metal and good conductivity.

An alternative embodiment may use crosslinking of functional molecules incorporated directly into the stabilization layer of the metal particles. A functional group of this sort may be directly appended to the metal particle through an anchor group at the opposite end (through coordination chemistry, for instance), or it may extend from a polymeric "shell" or coating that encapsulates the metal particles. In either case, forming a chemical bond between two such functional groups, either directly or through linker molecules or other intermediaries, results in the direct fixation of the metal particles to each other. A more particular case of this general concept is given in Example II.6 below.

The added linker molecule may be photoactive at the energy of exposure. Alternatively, the linker may be activated, either directly or through a reaction intermediated by photoinitiators such as those listed below:

Type I photoinitiators, such as hydroxyl-acetophenones (e.g., Darocur 1173, Irgacure 2959), alkylamino-acetophenones (e.g., Irgacure 907, Genocure BDMM), benzyl ketals (e.g., Genocure BDK), bezoin ethers (e.g., BIPE[2-isopropoxy-2-phenylacetophenone], BNBE[2-n-butoxy-2-phenylacetophenone] and BIBE[2-isobutoxy-2-phenylacetophenone]), phosphine oxides (e.g., Speedcure TPO, Lucirin TPO-L, Irgacure 819), alpha-haloacetophenones and acid generators (e.g., 4-Phenoxy-2',2'-dichloroacetophenone, S-triazines, BMPS [tribromomethylsulfonylbenzene], Irgacure PAG 103), and others (e.g., Irgacure OXE-1/2, hexaarylbiimidazoles, Irgacure 784, 4,4'-diazidostilbene-2,2'-di-sodium sulfonate, 1-phenyl-1,2-propanedione).

Type II photoinitiators, such as Benzophenones (e.g., benzophenone, Genocure PBZ), Thioxanthones (e.g., Speedcure ITX, Genocure DETX, Speedcure 7010), and others (e.g., Irgacure MBF, Irgacure 754, camphorquinone, Speedcure EAQ, Omnipol SZ, fluorenone), as well as hydrogen donors, such as tertiary amines (e.g., Triethylamine, N,N-dimethylethanolamine, N-methyldiethanolamine, Triethanolamine), aminobenzoates (e.g., ethyl 4-(dimethylamino)benzoate, 2-ethylhexyl-4-dimethylaminobenzoate, isoamyl-4-(dimethylamino)-benzoate, 2-butoxyethyl 4-(dimethylamino)-benzoate, Speedcure 7040), thiols, and others (e.g., Michler's ketone, ethyl Michler's ketone, acrylated amine oligoamines). Other materials include Genocure and Irgacure from Rahn AG (Switzerland), Darocur and Lucirin from BASF SE (Germany), and Speedcure from Lambson Ltd. (UK). Various combinations of such materials may also be used.

This method could also be based on the chemistry of standard negative photoresists containing a cyclized poly(cis-isoprene) and a bis-arylazide sensitizer.

The mode of action of the above chemicals is as follows: Upon exposure, the photoinitiator forms free radicals to the depth of photon penetration. These free radicals initiate the polymerization or crosslinking of the organic building blocks to form linear polymers or polymer networks to the depth of photon penetration, and thus render the layer insoluble. In general, the depth of exposure is limited by the reflection, absorption and scattering of the metal particles. In an optimized formulation, however, multi-scattering by the particles in the NP ink layer may enable the photons to penetrate deeper into the layer. Furthermore, the use of an ink with a single homogeneous phase, such as those based on metal-organic complexes, may facilitate photon penetration relative to nanoparticle-based suspensions.

Components that result in the formation of linear polymers that are still soluble in selected solvents may be preferable in some cases, since the linear polymers can then be removed easily upon sintering. By contrast, branched crosslinked polymers, if formed, are much more difficult to remove by sintering.

Example II.2: Thermal Curing of the Bulk Film by a Photonic Mechanism with UV, Visible, or Near IR Laser Source This embodiment is similar to the mechanism described above, except that instead of photo-induced crosslinking via a photoinitiator, fixing of the NP matrix is induced by conversion of the photons absorbed by the ink into thermal energy. Surfactants used in this embodiment may be cured directly, or with the aid of a suitable catalyst or accelerators.

The available materials for use in thermal curing are similar to those described in the preceding example, including monomers, oligomers or polymers with functional groups available for polymerization, crosslinking or other intermolecular interactions to render the matrix insoluble in a given solvent. Examples may include, but are not limited to, acrylates, methacrylates, epoxies, urethanes, melamine, and their oligomers, as well as polyvinyl pyrrolidones, polyvinyl acids and polyacrylic acids. Appropriate catalysts or accelerators with a thermal activation mechanism could be added, such as blocked peroxides or blocked bases. Alternatively, catalytic quantities of reducing agents (for examples, peroxides or persulfates) or latent acids, as appropriate, could be used.

As noted earlier, the photonic exposure and activation mechanisms described above are limited in thick ink films by the finite absorption and scattering depth. This limitation places an upper bound on the film thickness of NP suspension inks that can be used with radical-catalyzed polymerization (depending on density of NPs). Thermal activation of suitable monomers with thermally-activated catalysts can overcome this problem. In this case, the laser radiation heats the ink in the required pattern and activates polymerization. This thermal mechanism is less limited by optical absorption and can thus work with thicker films by thermal transfer. Resolution of the patterns thus obtained is close to the optical exposure resolution, as the effect of lateral heat diffusion is balanced by reduced reaction rate (which depends exponentially on temperature).

Example II.3: Dimerization/Crosslinking of Soluble Monomer/Oligomer to Insoluble Dimer/Oligomer This embodiment is similar to Example II.1, but in this case the film is rendered insoluble, upon laser irradiation, by partial polymerization (desirably dimerization), rather than longer-range polymerization or crosslinking. This feature facilitates elimination of organic molecules upon sintering. Suitable materials with limited condensation can provide a good process window for solubility. Monomers that form insoluble dimers and can be used for this purpose include, for example, several isocyanates, such as methylene diphenyl diisocyanate.

Example II.4: Curing of Anhydrides by Selectively Removing Solvent

In this embodiment, linear polymers are formed through the polymerization, upon laser irradiation, of bifunctional small molecules with an acyl terminal group. The degree of polymerization can be controlled, and the linear products are relatively easy to eliminate during the sintering stage. There is a wide range of monomers available for this chemistry, so that solubility and stability of the matrix after irradiation can be tuned. Alternatively, such molecules can be used to crosslink another polymer, such as poly(4-vinylphenol).

Since this is a thermally-triggered method, the highly absorbent nature of the NP ink dispersions does not substantially limit the depth of curing.

Molecules that may be used for this purpose include anhydrides, acyl chlorides and carboxylic acid. Particular examples include, but are not limited to, 4,4'-(hexafluoroisopropylidene)diphthalic anhydride, benzophenone-3,3',4,4'-tetracarboxylic dianhydride, ethylenediaminetetraacetic dianhydride, diethylenetriaminepentaacetic dianhydride, 3,3',4,4'-biphenyltetracarboxylic dianhydride, biphenyl-4,4'-dicarboxylic acid, suberic acid, sebacoyl chloride, terephthalic acid, and adipic acid.

Example II.5: Air-dry Induced Polymerization

This embodiment is similar to drying of oil-based paints and is suitable for NP inks based on non-polar dispersions or solutions, with the addition of suitable alkyds having a controlled drying property. Alkyds are polyesters modified by the addition of fatty acids (and other components). They are derived from polyols and a dicarboxylic acid or carboxylic acid anhydride. While some alkyds polymerize upon drying, short oil alkyds need some heat to polymerize, which is provided by the laser irradiation. These resins are common in oil-based paints, for instance, and therefore are commercially available and their chemistry is well-known.

Example II.6: Formation of Coordination Polymers Incorporating Metal NP

A coordination polymer is an inorganic or organometallic polymer structure containing metal cation centers linked by ligands, extending into an array. The metal nanoparticles bind to each other via an organic linker. Such linkers can range from small molecules to dendritic structures, whose end groups are capable or forming coordination bonds. Common examples include thiols, amines, pyridyl and carboxylates.

In this embodiment, a protecting group that can be removed by thermal or photonic activation is added to the NP ink. As a result, coordination polymers are formed under laser irradiation between ligands present in the NP ink films and the metal of the nanoparticles. Regions where the protecting group has been removed and the coordination polymer is formed will be relatively insoluble, while unexposed areas can be rinsed away. Coordination bonds can be relatively weak, and if small bifunctional molecules are used as the ligands, they can be readily eliminated upon sintering.

Rigid rod and other linear bifunctional ligands are commercially available. Protecting groups for these molecules are known in the art of selective protection during organic synthesis. The desired protected molecules can thus be synthesized using methods and materials that are known in the art, often in a one-pot reaction.

Example II.7: Incorporation of Metal NP Suspension (Ink) in a Sacrificial Resin Matrix In this embodiment, a metal NP ink is combined with a compatible sacrificial resin matrix, such as rosin or a polyalkylene carbonate (PAC). The laser beam is then used to ablate or burn the resin in areas to be written. The beam energy should be sufficient to eliminate the protective organic shell that covers many common stabilized nanoparticles. These exposed nanoparticles will have enough cohesion to withstand subsequent solvent strip and rinse. The unexposed areas, however, are dissolved together with the embedded metal nanoparticles in the appropriate solvent. The remaining metal nanoparticles are then sintered thermally or photonically.

Alternatively, the sacrificial resin matrix may consist, entirely or partially, of a material, such as a polymer or resin, with a low melting temperature. Upon exposure at a wavelength that is absorbed by the film or one of its components, the material is softened or melted. Upon cooling, the material solidifies and hardens, adhering to the surface of the metal nanoparticles and resulting in cohesive forces the prevent the metal particles from being rinsed away in the exposed areas. The material with the low melting temperature may be coated as a shell on the metal nanoparticles, either as or in addition to the stabilization layer.

Method III—Bilayer Inks

In these embodiments of the present invention, only an outer layer of the matrix is fixed by laser irradiation, rather than the bulk as in Method II. In some of these embodiments, after drying the metal ink layer on the substrate, a thin organic layer is deposited to entirely coat the dried metal ink layer. (A dried ink can easily be overcoated.) A distinct top layer can alternatively be obtained by adding to the ink a crosslinkable surfactant (e.g., BYKUV 35XX from ALTANA Chemie, Germany), with properties that drive the additive to the surface so that it spontaneously forms a continuous top layer. A number of the embodiments described above in the context of Method II may be adapted, mutatis mutandis, to operate within such a top layer, whether formed spontaneously or by overcoating.

In either case, the top layer of the matrix before fixation comprises a thin photosensitive material, which is polymerized or crosslinked on exposure to a scanning laser (typically UV or visible) or by thermal effect. This thin polymerized top layer protects the ink from the solvent, which is then used to wash out the rest of the unexposed material and the ink underneath. This approach allows even lower laser power to be used in generating the protection layer than in the preceding methods. It may be more suitable for low-aspect-ratio patterns, since it does not provide side protection of the traces.

An additional benefit of Method III is that the additive, which resides only on the surface, makes up only a small fraction of the total material volume and weight (typically 1-3% of the total volume) as a thin film, and is therefore easier to eliminate in the sintering process. Methods II and III could therefore be combined when dealing with fine line patterns.

Some specific mechanisms for implementing Method III will now be described in detail:

Example III.1: Crosslinking of a Reactive Surfactant Polymer Layer to Form a Protective Coating In this embodiment, as explained above, a self-crosslinkable surfactant and a photoinitiator (with absorption at the appropriate wavelength) is typically to the ink suspension, leading to formation of a protective layer over the NP ink where exposed to the photonic source. The additives should be compatible with the solvents used in the NP ink. Such additives may include self-crosslinkable surfactants with acryl-functional groups (for example polyether-modified acryl-functional polysiloxane, as in the Altena BYK UV35XX series of surface additives). These materials orient themselves at the surface due to its interfacial activity and can be cured by UV or electron beam irradiation into a crosslinked polymer network by acrylic functionality.

The same sorts of photoinitiators as were listed above in Example II.1 may be used in the present embodiment.

In operation of this mechanism, the surfactant-type monomer migrates to the surface of the ink layer and forms a film. Upon exposure, the photoinitiator forms free radicals up to the depth of penetration, causing the functional monomers to crosslink so as to form a thin, insoluble film at the surface.

This protective layer serves to keep the exposed features undissolved when the substrate is subsequently rinsed and washed.

When thermal curing is used, surface crosslinking or polymerization is induced by conversion of the photons absorbed by the NP ink into thermal energy. The surfactants may be cured directly, or with the aid of suitable catalysts or accelerators. Similar sorts of additives may be used in this case, such as monomers, oligomers and polymers with functional groups available for polymerization, crosslinking or other intermolecular interactions that render the film insoluble in a given solvent. Examples may include, but are not limited to, acrylates, methacrylates, epoxies, urethanes, and their oligomers, as well as polyvinyl pyrrolidones, polyvinyl acids and polyacrylic acids.

Example III.2:Crosslinking or Polymerization of a Reactive Layer Overcoated on the Ink Film to Form a Protective Coating In this embodiment, the NP ink is overcoated with an additional layer that contains a monomer, oligomers or polymer that can be cured, crosslinked, polymerized or otherwise rendered insoluble upon exposure with photonic energy. The overcoat may include, for example (but without limitation), acrylates, methacrylates, epoxies, urethanes or their oligomers, as well as polyvinyl pyrrolidones, polyvinyl acids or polyacrylic acids. The overcoating material may be based on the same solvent present in the ink itself, but should not be miscible with the ink. The overcoat is selectively patterned by exposure to the photonic beam, and then rinsed in a solvent. The exposed material will remain as a protective film, while unexposed areas are stripped away. An additional step, using another solvent, may be required to rinse away the underlying ink films from the areas from which the protective film has been stripped, while the covered regions would remain intact.

The same sorts of photoinitiators as were listed above in Example II.1 may be used in the present embodiment. As noted earlier, some of the other mechanisms described above under Method II may similarly be adapted to operate in the surface layer of the matrix in alternative implementations of Method III.

Method IV—Laser Exposure of Matrix Areas that are to be Removed

In an alternative embodiment of the present invention, the process of pattern exposure in writing machine 30 (FIG. 1) is reversed, in the sense that instead of exposing the locus of the pattern itself to the laser, the laser may expose the "negative" of the pattern, i.e., the area that excludes the locus of the pattern. This approach is useful when working with ink materials possessing properties similar to "positive photoresist," in which case the ink exposed to laser radiation is destabilized relative to the unexposed ink (rather than stabilized by laser exposure as in the examples above). Positive photoresists are well known in the art of electronics manufacturing, particularly in the display industry and semiconductor industry, where high-resolution patterns are required.

Typically, the present embodiment relies on a thermal mechanism to destabilize the irradiated ink, wherein one of the components of the dried ink layer is a species such as a supramolecular polymer, which upon heating undergoes a chemical change or phase change that renders it more soluble. In some cases, the supramolecular polymer may be the ink dispersant itself, rather than an additive to the ink. Activation of the supramolecular polymer may be achieved through an intermediate process, for example using a blocked acid component added to the mixture, which upon heating renders the polymer soluble by changing the local acidity.

Specific mechanisms for implementing Method IV may include the following:

Example IV.1: Decomposition of Supramolecular Polymer

Supramolecular polymers have been engineered with reversible intermolecular bonding, which can be released upon application of an external trigger, such as heating. One example of a commercially-available supramolecular polymer of this sort, with a thermal trigger, is SupraB, developed at Eindhoven University of Technology and marketed by Suprapolix NV. In effect, these materials carry out a reversible crosslinking process. In the present embodiment, such a polymer is added to a metal-loaded NP ink. The resulting matrix is then rendered soluble by heating locally with a photonic source. The area that has been heated in this manner can be removed by a wet etch process, followed by sintering of the remaining film.

Example IV.2: Addition of Supramolecular Polymer-solubility Control Via Latent Acid Activation In this embodiment, an intermediary, such as a latent acid catalyst, is activated by laser irradiation in order to interrupt the weak intermolecular bonds of the supramolecular polymer in the NP ink. As a consequence, the thermal energy required for decomposition may be lower than in the preceding example, and the thickness of the reaction in the matrix will not be limited by absorbing layers.

Example IV.3: Hydrolysis of Acrylic/Polyamide Polymer

Polymers such as polyamides, polyacrylates and polyureas can undergo hydrolysis. These reactions are generally acid- or base-catalyzed. Examples of common blocked (or latent) acid catalysts are the Nacure and K-cure lines from King Industries. Latent bases have also been reported. Thus, in this embodiment, a protected catalyst of this sort is incorporated in the NP ink film. The catalyst is activated by photonic or thermal release, and thus causes an otherwise insoluble polymer to be rendered soluble. As in the preceding examples, the exposed areas of the ink matrix are then stripped away, while the regions not exposed would remain intact and then undergo sintering.

Method V—Pattern Definition by Reflectivity Change

In an alternative embodiment, the step of washing away the unstable part of the matrix can be replaced by large-area laser ablation. This embodiment relies on the characteristic that the areas of the matrix that are fixed by exposure to radiation in writing machine 30 are typically highly reflective and therefore are selectively not ablated. The laser ablation of the unexposed areas of the matrix can be carried out simultaneously with sintering of the exposed areas, using the same source of radiation. Alternatively, sintering can be performed as a separate step, as in the preceding embodiments, after ablation of the unexposed areas of the matrix.

The pattern definition step carried out by writing machine 30 involves, in this case, a controlled change of the reflectivity of the matrix. The layer reflectivity along the traces scanned by the laser is enhanced because the metallic NP concentration increases due to local heating and controlled removal of a part of the organic ingredients in the ink.

Once a high-reflectivity pattern has been generated in this manner, controlled ablation selectively removes only the unexposed parts of the matrix, which still have low reflectivity, while the high-reflectivity pattern remains intact. Such selective material removal can be achieved by using a pulsed laser source, which is strongly absorbed in the non-patterned regions and at the same time is strongly reflected by the pre-exposed, highly-reflective traces.

By way of an example, a metal NP ink may have, before patterning, a reflectivity of approximately R=20%, so that 80% of the incident laser power is absorbed in the layer. After exposure in writing machine 30, the patterned trace area typically has a reflectivity of about R=80%, i.e., absorption of only 20%. Thus, absorption of the pulsed laser radiation that is used for ablation in the unexposed matrix is larger by a factor of four in comparison to the pre-exposed traces. The unexposed matrix will therefore have a much lower ablation threshold than the traces and can be ablated selectively by applying a laser fluence that is greater than the ablation threshold of the unexposed matrix but less than that of the exposed traces. Even a factor of two difference in the absorption of the pulsed laser radiation by the different areas is sufficient to support this sort selective ablation.

This ablation-based approach is particularly advantageous in generating thick metal patterns, since reflectivity relates only to the properties of the top surface of the ink. Consequently, the amount of energy required to write a pattern in a thick layer will in this case not be much different from the energy needed for thin layers, since only the surface properties of the matrix need to be changed. This method is also useful in dealing with layers that are not necessarily of uniform thickness.

Alternative Methods

Processes similar to those described above can be used for generation of non-metal trace patterns in NP materials. For example, the methods described above may be applied, mutatis mutandis, in creating functional patterns in silicon NP inks, ceramic NP inks and magnetic NP inks, which have recently become commercially available.

In an alternative embodiment, the methods described herein may be applied using metal inks and pastes that contain no nanoparticles at all, such as inks containing metal complexes. Upon irradiation, by either UV excitation or a thermal process induced by laser irradiation and absorption, a chemical reaction takes place that results in formation of metal particles or a metal film. For example, such particles or films may be created as the outcome of a process of photoreduction of metal salts, wherein positive metal ions (e.g., Ag+) turn to neutral (Ag) atoms, which then form metallic particles or films. Such inks and pastes can be treated in a similar manner to the two-step sintering process described above. Suitable metal complex inks for this purpose are available, for example, from InkTec Co., Ltd. (Ansan-City, South Korea), Gwent Electronic Material Ltd. (Pontypool, UK), Kunshan Hisense Electronic Co., Ltd. (Kunshan, China), and NeoDec BV (Eindhoven, Netherlands), among others. Such inks are available with silver, copper and aluminum complexes and possibly other metals, as well.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for manufacturing, comprising:
coating a substrate with a matrix containing a material to be patterned on the substrate and comprising a photosensitive surfactant additive, which migrates to a top surface of the matrix so as to form an outer layer;
irradiating the coated substrate with an energy beam so as to activate the surfactant additive in order to fix a pattern in the outer layer of the matrix without fixing a bulk of the matrix or sintering the material that is to be patterned in the matrix, such that a resistivity of the patterned material remains at least ten times greater than a final resistivity that is to be achieved after full sintering;
removing the matrix remaining on the substrate outside the fixed pattern; and
after removing the matrix, sintering the material in the pattern so as to achieve the final resistivity of the patterned material.

2. The method according to claim 1, wherein irradiating the coated substrate causes polymerization or crosslinking of the outer layer of the matrix.

3. The method according to claim 2, wherein the substrate photosensitive surfactant additive comprises a photoinitiator, and wherein irradiating the coated substrate causes the photoinitiator to release free radicals in the outer layer, which induce the polymerization or crosslinking.

4. The method according to claim 2, wherein irradiating the coated substrate causes heating in the outer layer, which thermally induces the polymerization or crosslinking.

5. The method according to claim 1, wherein the material to be patterned comprises nanoparticles.

6. The method according to claim 1, wherein sintering the material comprises applying a bulk sintering process to the pattern fixed on the substrate.

7. The method according to claim 1, wherein coating the substrate comprises drying the matrix on the substrate before irradiating the coated substrate.

8. The method according to claim 1, wherein irradiating the coated substrate comprises directing the energy beam to impinge on a locus of the pattern.

9. The method according to claim 1, wherein removing the matrix comprises applying a solvent to remove the matrix remaining on the substrate outside the fixed pattern.

10. The method according to claim 1, wherein removing the matrix comprises ablating the matrix remaining on the substrate outside the fixed pattern.

11. A method for manufacturing, comprising:
coating a substrate with a matrix comprising a sacrificial resin and containing nanoparticles to be patterned on the substrate;
irradiating the coated substrate with an energy beam so as to fix a pattern in the matrix by modifying a state of the sacrificial resin so as to cause cohesion between the nanoparticles without fully sintering the nanoparticles, such that a resistivity of the pattern remains at least ten times greater than a final resistivity that is to be achieved after full sintering;
removing the matrix remaining on the substrate outside the fixed pattern; and
after removing the matrix, sintering the nanoparticles in the pattern so as to achieve the final resistivity of the pattern.

12. The method according to claim 11, wherein irradiating the coated substrate releases thermal energy in the matrix, which causes at least one of polymerization and crosslinking of a molecular component within the pattern.

13. The method according to claim 11, wherein the nanoparticles comprise a metal, and wherein irradiating the coated substrate causes formation of a coordination polymer linking the metal to a ligand.

14. The method according to claim 11, wherein sintering the nanoparticles comprises applying a bulk sintering process to the pattern fixed on the substrate.

15. The method according to claim 11, wherein coating the substrate comprises drying the matrix on the substrate before irradiating the coated substrate.

16. The method according to claim 11, wherein irradiating the coated substrate comprises directing the energy beam to impinge on a locus of the pattern.

17. The method according to claim 11, wherein irradiating the coated substrate comprises directing the energy beam to impinge on an area of the coated substrate area that excludes a locus of the pattern.

18. The method according to claim 11, wherein removing the matrix comprises applying a solvent to remove the matrix remaining on the substrate outside the fixed pattern.

19. The method according to claim 11, wherein removing the matrix comprises ablating the matrix remaining on the substrate outside the fixed pattern.

20. The method according to claim 11, wherein modifying the state of the sacrificial resin comprises ablating or burning the resin within the pattern.

21. The method according to claim 11, wherein modifying the state of the sacrificial resin comprises softening or melting the sacrificial resin, so that upon cooling, the sacrificial resin adheres to the nanoparticles.

22. A method for manufacturing, comprising:
coating a substrate with a matrix containing a material to be patterned on the substrate;
irradiating the coated substrate with a first energy beam so as to fix a pattern in the matrix while increasing a reflectivity of the matrix within a locus of the pattern by directing the energy beam to impinge on the locus of the pattern without fully sintering the material in the matrix;
ablating the matrix remaining on the substrate outside the fixed pattern without ablating the locus of the pattern by irradiating the matrix with a second energy beam at a fluence that is less than an ablation threshold of the matrix within the locus of the pattern; and
after ablating the matrix, sintering the material in the pattern.

23. The method according to claim 22, wherein the material to be patterned comprises nanoparticles.

24. The method according to claim 22, wherein sintering the material comprises applying a bulk sintering process to the pattern fixed on the substrate.

25. A system for manufacturing, comprising:
a coating machine, which is configured to coat a substrate with a matrix comprising a sacrificial resin and containing nanoparticles to be patterned on the substrate;
a writing machine, which is configured to irradiate the coated substrate with an energy beam so as to fix a pattern in the matrix by modifying a state of the sacrificial resin so as to cause cohesion between the nanoparticles without fully sintering the nanoparticles, such that a resistivity of the pattern remains at least ten times greater than a final resistivity that is to be achieved after full sintering;
a matrix removal machine, which is configured to remove the matrix remaining on the substrate outside the fixed pattern; and
a sintering machine, which is configured to sinter the material in the pattern after removal of the matrix so as to achieve the final resistivity of the pattern.

\* \* \* \* \*